United States Patent [19]

Nercessian

[11] 4,207,475
[45] Jun. 10, 1980

[54] EFFICIENT BIPOLAR REGULATED POWER SUPPLY

[75] Inventor: Sarkis Nercessian, Flushing, N.Y.

[73] Assignee: Kepco, Inc., Flushing, N.Y.

[21] Appl. No.: 929,308

[22] Filed: Jul. 31, 1978

[51] Int. Cl.² .............................................. G05F 1/56
[52] U.S. Cl. ...................................... 307/52; 307/77; 323/20; 323/25
[58] Field of Search ................................ 307/52-55, 307/60, 61, 77; 323/20, 23, 25, 40; 363/131, 133, 134

[56] References Cited

U.S. PATENT DOCUMENTS

| | | | |
|---|---|---|---|
| 3,466,455 | 9/1969 | Hecht et al. | 323/25 X |
| 3,697,862 | 10/1972 | Taylor | 323/20 X |
| 3,935,529 | 1/1976 | Kalmanash et al. | 307/52 X |
| 4,004,155 | 1/1977 | Nercessian | 307/52 |

Primary Examiner—A. D. Pellinen
Attorney, Agent, or Firm—Alfred W. Barber

[57] ABSTRACT

In a bipolar regulated power supply, two pass devices (transistors) are connected in a complementary symmetry circuit, one controlling the current from a positive voltage source and the other the current from a negative voltage source. One pass device connected in a first control loop is controlled by a source of input signals and feedback from the output terminal. A second control loop maintains a constant quiescent current in the two pass devices. In order to maintain this quiescent current in the presence of load current, a second feedback to the second loop, sensing load current, is provided.

3 Claims, 1 Drawing Figure

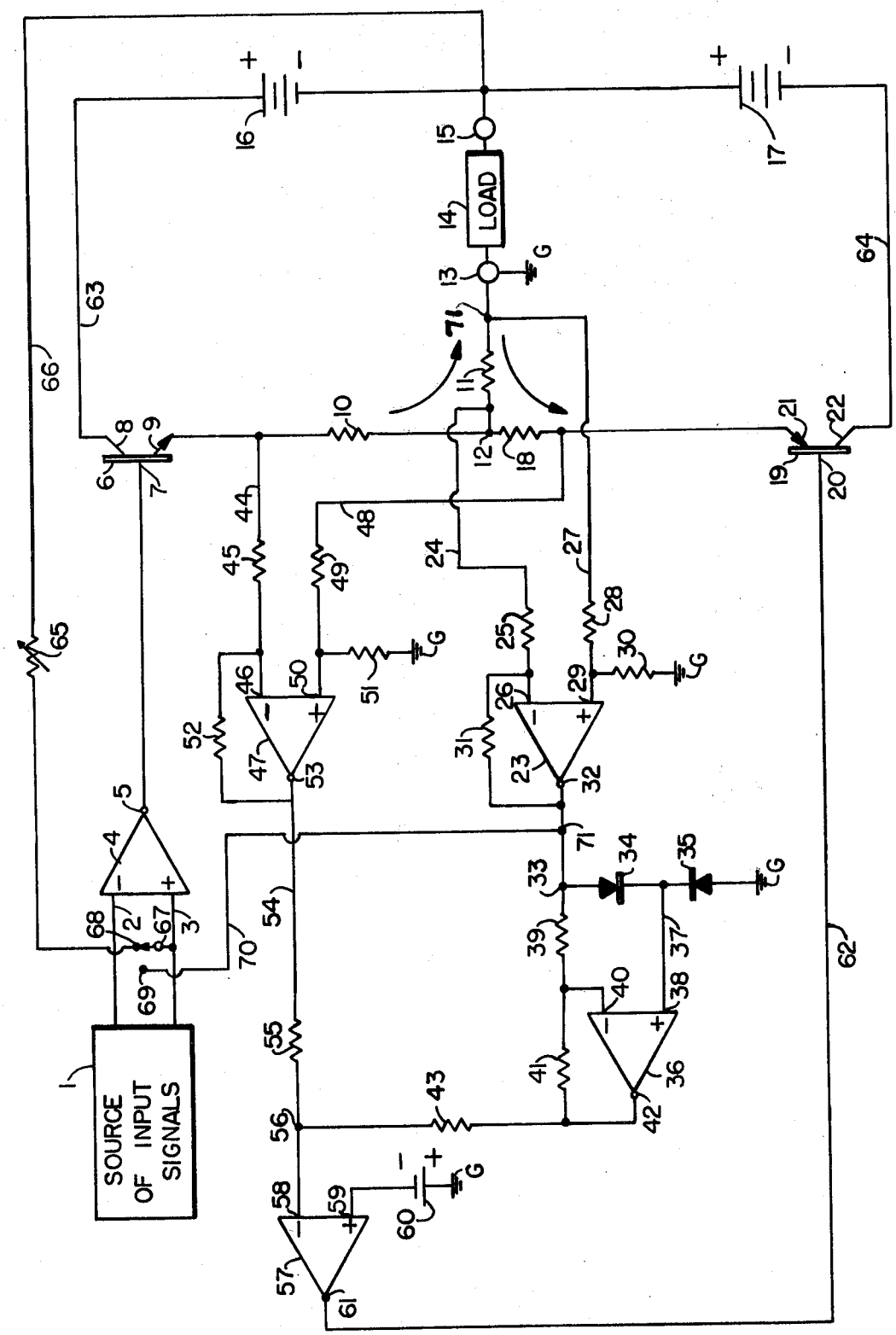

EFFICIENT BIPOLAR REGULATED POWER SUPPLY

PRIOR ART

The prior art is well represented by U.S. Pat. No. 4,004,155 in which two control elements (tubes or transistors) are connected across a load. One of these control elements is set to pass a constant current through the load equal to at least the maximum current to be programmed. The second control element is controlled by an input signal and must be capable of passing at least twice the maximum current to be programmed through the load. The actual load current is the difference between the steady current passed by the first control element and the signal controlled current passed by the second control element.

While the above described system operates well to pass a desired bipolar current through the load, it is rather inefficient. For example, in order to provide zero current through the load each pass element must carry a current equal to the maximum current to, be programmed. At maximum load current in one direction one control element must pass maximum current and the second control element must pass zero current. However, in order to pass maximum current in the other direction, one control element must pass this maximum current while the other must pass double this current.

PRESENT INVENTION

In accordance with the present invention two pass transistors of opposite polarity are connected in series with a source of positive voltage and a source of negative voltage and a common load so that bipolar voltage and current can be programmed to the load through the use of a first degenerative control loop. The second control loop employs two feedbacks. The first feedback includes two current sensing resistors, one in series with each of the pass transistors. One of the pass transistors is controlled by a source of input signals while the other pass transistor is controlled by the second control loop in such a way that with no current supplied to the load, the currents through the two pass transistors are equal and opposite. These currents may be considered as quiescent currents for the purpose of eliminating crossover distortion in bipolar operation.

The second feedback comes into play when current is passed through the load. Load current is sensed and the resulting voltage drop is amplified and unidirectionalized. This resulting voltage is added to the control voltage going to the second transistor so that its current level is raised in keeping with the demands of the input signal to the first pass transistor. Thus, when current is passed through the load, appropriate current is available from both pass transistors.

The advantage over the prior art is a substantial increase in efficiency in all modes of operation. At the same time quiescent current is supplied eliminating cross-over distortion.

Provision is made for operating the regulator either in voltage or current control mode.

The Drawing is a simplified block diagram of the preferred form of the invention.

The primary circuit on first loop includes a source of input signals 1 (bipolar) applied to inverting input 2 and noninverting input 3 of operational amplifier 4 the output 5 of which is coupled to base 7 of first pass transistor 6. Collector 8 of pass transistor 6 is connected to a suitable source of positive voltage represented by battery 16 over lead 63. The emitter 9 of pass transistor 6 is connected through a first current sensing resistor 10 to junction point 12. The negative half of the circuit comprises transistor 19 having its emitter 21 connected through a second current sensing resistor 18 also to junction point 12. The collector 22 of pass transistor 19 is connected to a suitable source of negative voltage represented by battery 17 over lead 64. Base 20 of transistor 19 receives its signals over lead 62 in a manner to be described in detail below. The negative side of positive voltage source 16 and the positive side of negative voltage source 17 are joined and connected to load terminal 15. The load 14 is connected between load terminals 13 and 15. Load terminal 13 is connected to ground G, the common of the system. Common terminal 13 is connected through current sensing resistor 11 to junction point 12. Voltage feedback is taken from load terminal 15 over lead 66, through gain control resistor 65 to terminal 68 of switch 67-68-69. The common terminal 67 is connected to noninverting input 3 of operational amplifier 4. Disregarding for the moment the base control of pass transistor 19, the primary circuit just described is a complementary symmetry bipolar control circuit including degenerative feedback. The reason the feedback is connected to the non-inverting input of operational amplifier 4 is that there is phase reversal in the positive pass transistor 6 at the feedback point 15.

The unique operation of the circuitry of the present invention depends on a second current sensing feedback loop. This second loop is mainly responsible for the establishment of a quiescent current in both the positive and negative pass transistors. The voltage drop across the two current sensing resistors 10 and 18 over leads 44 and 48 and through input resistors 45 and 49 is applied to inverting input 46 and non-inverting input 50 respectively of operational amplifier 47. The gain applied to these voltages at the output of amplifier 47 at output terminal 53 is predetermined by feedback resistor 52 and input shunt resistor 51. This voltage at output terminal 53 on line 54 through resistor 55 is applied to inverting input 58 of operational amplifier 57. A predetermined reference voltage represented by battery 60 is applied between ground G and non-inverting input terminal 59. The amplified difference voltage between that applied to terminal 58 and the reference voltage applied to terminal 59 appears at output terminal 61 and is applied over lead 62 to base 20 of negative voltage pass transistor 19. This loop causes negative voltage pass transistor 19 to pass a current through its current sensing resistor 18 equal to that passed through current sensing resistor 10 by positive voltage pass transistor 6 when no current is being supplied to load 14. This may be considered the quiescent current.

As a typical example, the following values of the various resistors provides a quiescent current of 220 milliamperes:
 resistor 10=0.2 ohm
 resistor 18=0.2 ohm
 resistor 45=1.1K ohms
 resistor 52=2.74K ohms
 resistor 49=1.1K ohms
 resistor 51=2.74K ohms
 resistor 55=1K ohms
 resistor 43=10K ohms reference voltage 60=0.2 volt The second control loop includes a second feedback which serves to change the current supplied by negative voltage pass transistor 19 in accordance with the current to be passed through load 14. The voltage drop due to load current through current sensing resistor 11 is applied over line 24 and through input resistor 25 to inverting input terminal 26 of operational amplifier 23. The non-inverting input 29 is connected across shunt resistor 30 and through input series resistor 28 and over line 27 to resistor terminal 71. This input circuit to amplifier 23 is a differential input sensing only the drop across resistor 11 and unaffected by common mode voltage which may exist in the load lead between terminal 71 and the load ground terminal 13. The current induced voltage drop across resistor 11 is amplified by amplifier 23 by a predetermined amount equal to the ratio of feedback resistor 31 to input resistor 25 and appears at output terminal 32 of amplifier 23. This voltage is unidirectionalized (i.e. its absolute value is repeated) by a circuit comprising diodes 34 and 35 connected in opposition between junction point 33 and ground connected between output operational amplifier 36 has its non-inverting input 38 connected to the junction between diodes 34 and 35 over lead 37 and its inverting input 40 connected through input resistor 39 to junction point 33 and feedback resistor 41 connected between inverting input 40 and output terminal 42 of amplifier 36. The gain of the amplifier is equal to 1 as determined by the ratio of feedback resistor 41 to input resistor 39. When the voltage at the output terminal 32 is positive with respect to ground, diode 34 conducts, diode 35 is back biassed and the positive voltage at output terminal 32 is applied over line 37 to non-inverting input 38 to be amplified by the gain of amplifier 36 to appear at its output terminal 42 amplified and positive with respect to ground. When the output of amplifier 23 at terminal 32 is negative, diode 34 is back biassed and diode 35 conducts in effect grounding non-inverting input terminal 38 and thereby applying the output voltage of amplifier 23 to inverting input terminal 40 to be amplified and inverted by amplifier 36 to appear at output terminal 42 again as an amplified voltage positive with respect to ground. Thus, the output of amplifier 23 is amplified and unidirectionalized by the circuit just described. The unidirectionalized voltage is applied through resistor 43 at junction poine 56 to inverting input terminal 58 of amplifier 57. This positive current at junction point 56 must be balanced by an equal negative current from the first feedback of the second control loop. This negative current is generated by the voltage at the output 53 of amplifier 47 through resistor 55 and is proportional to the drop across the current sensing resistors 18 and 10. This voltage across resistors 18 and 10 will change until a balance is achieved between input terminals 58 and 59 of amplifier 57. Thus, the second current control loop changes the current passed by negative polarity pass transistor 19 as a function of the load current demand and maintains the quiescent current in both pass devices.

Typical resistor values in this second current control loop are as follows (for a ±2 ampere power supply):
resistor 11=0.25 ohm
resistor 28=750 ohms
resistor 30=15K ohms
resistor 25=750 ohms
resistor 31=15K ohms
resistor 39=10K ohms
resistor 41=10K ohms The above description covers the operation of this bipolar regulator as a voltage programmed regulator. Similar operation is provided when the regulator is used as a current regulator. Basically the current regulating operation is provided by feeding back a load current sensed voltage rather than the load voltage. One way to accomplish current regulation is to apply the load current sensed and amplified voltage appearing at the output terminal 32 of amplifier 23 to the non-inverting input 3 of amplifier 4 over lead 70 by closing switch contacts 67-69 and opening switch contacts 67-68 and thereby comparing load current with the input signals from source 1 (rather than load voltage). Othewise the regulator operates as described above.

While the preferred form of the invention has been shown and described above, modifications are possible within the spirit and scope of the invention as set forth, in particular, in the appended claims.

I claim:

1. In a bipolar regulated power supply the combination of;
   a pair of load terminals;
   a first circuit connected across said load terminals including, in series a source of voltage of one polarity, a first signal controllable pass device, a first current sensing resistor and a second current sensing resistor;
   a second circuit connected across said load terminals including in series, a source of voltage of a second polarity, a second signal controllable pass device, a third current sensing resistor having a value equal to said first current sensing resistor and said second current sensing resistor;
   means for controlling said first signal controllable pass device including a source of input signals and a load voltage or current feedback circuit;
   and means for maintaining a substantially constant quiescent current through both of said pass devices in addition to bipolar current to said load terminals if any;
   wherein said means for maintaining a substantially constant quiescent current includes two interdependent control circuits coupled to control said second pass device, one including means for sensing the voltage across said first and third current sensing resistors taken in series and the second including means for sensing the voltage across said second current sensing resistor;
   means for repeating the absolute value of the latter said voltage;
   and means for combining said first said sensed voltage and said repeated voltage to provide said control to said second pass device.

2. A bipolar regulated power supply as set forth in claim 1, and;
   wherein said source of input signals is for controlling the voltage across the load terminals;
   and said feedback circuit is derived from means for sensing voltage across said load terminals.

3. A bipolar regulated power supply as set forth in claim 1, and;
   wherein said source of input signals is for controlling the current to said load terminals;
   and said feedback circuit is derived from means for sensing current to said load terminals.

* * * * *